(12) United States Patent
Lin et al.

(10) Patent No.: US 12,289,856 B2
(45) Date of Patent: Apr. 29, 2025

(54) TRAY AND ELECTRONIC DEVICE USING THE SAME

(71) Applicant: Wistron Corporation, New Taipei (TW)

(72) Inventors: Yu-Chen Lin, New Taipei (TW); Li-Shu Chen, New Taipei (TW); Ching-Hao Chen, New Taipei (TW)

(73) Assignee: Wistron Corporation, New Taipei (TW)

(*) Notice: Subject to any disclaimer, the term of this patent is extended or adjusted under 35 U.S.C. 154(b) by 181 days.

(21) Appl. No.: 18/082,589

(22) Filed: Dec. 16, 2022

(65) Prior Publication Data

US 2024/0130066 A1 Apr. 18, 2024

(30) Foreign Application Priority Data

Oct. 18, 2022 (TW) .................................. 111139383

(51) Int. Cl.
*H05K 7/14* (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS

| | | | | |
|---|---|---|---|---|
| 8,936,477 B1 * | 1/2015 | Kerrigan | .............. | H01R 43/205 439/157 |
| 10,251,300 B1 * | 4/2019 | Mao | .................... | H05K 7/1487 |
| 10,863,644 B1 * | 12/2020 | Tseng | ................... | H05K 7/1487 |
| 11,337,343 B2 | 5/2022 | Wang et al. | | |
| 2015/0029654 A1 * | 1/2015 | Li | ........................ | H05K 7/1487 361/679.32 |
| 2016/0064040 A1 * | 3/2016 | Hartman | .............. | H05K 7/1402 360/97.12 |
| 2019/0108860 A1 * | 4/2019 | Han | ...................... | H05K 5/0221 |
| 2021/0068317 A1 | 3/2021 | Wang et al. | | |

FOREIGN PATENT DOCUMENTS

| | | |
|---|---|---|
| CN | 2681210 | 2/2005 |
| CN | 217523063 | 9/2022 |
| TW | 202111471 | 3/2021 |

OTHER PUBLICATIONS

"Office Action of Taiwan Counterpart Application", issued on May 4, 2023, p. 1-p. 7.

* cited by examiner

*Primary Examiner* — James Wu
*Assistant Examiner* — Christopher L Augustin
(74) *Attorney, Agent, or Firm* — JCIPRNET

(57) ABSTRACT

A tray and an electronic device using the same are provided. The tray used to carry an expansion card includes a base, a tray body, a sliding plate, and a limiting spring. The tray body is slidably disposed on the base and has a base portion and two side walls disposed on two sides of the base portion. The sliding plate is slidably disposed on the base portion and is able to be moved away from or close to one of the side walls relative to the tray body selectively. The limiting spring is disposed on the base portion and is used to limit the sliding plate.

20 Claims, 8 Drawing Sheets

TRAY AND ELECTRONIC DEVICE USING THE SAME

CROSS-REFERENCE TO RELATED APPLICATION

This application claims the priority benefit of Taiwan application serial no. 111139383, filed on Oct. 18, 2022. The entirety of the above-mentioned patent application is hereby incorporated by reference herein and made a part of this specification.

BACKGROUND

Technical Field

The disclosure relates to a tray and an electronic device, and particularly to a tray and an electronic device using the tray that are suitable for expansion cards of different sizes.

Description of Related Art

The expansion card is usually needed to be plugged into an electronic device to expand the usage scope of the electronic device. Take a server for example, a redundant array of independent disks (RAID) card, a peripheral component interconnect express (PCIe) card, etc. may be plugged into the server. With the development of technology, the amount of data computed and stored in the server is increasing, which causes the existing server to be unusable, so increasing the number of expansion cards used can be considered. However, limited by the planning of the original space in the server or other considerations, the dimensions and fastening screw holes of the newly added expansion card are different from the existing design.

Under the limitations of derivation of the previous generation of casing and the need to share mechanism fixing members with the existing expansion cards, it is difficult for the new expansion card to expand the dimensions in order to meet the signal function and for the screw holes to be the same as the existing expansion card.

Therefore, designing a common mechanism that can satisfy expansion cards of different sizes is an urgent issue to be solved at present.

SUMMARY

The disclosure provides a tray that can adapt to expansion cards of different sizes.

The disclosure provides an electronic device with the convenience of assembly.

A tray of the disclosure is suitable for carrying an expansion card, and the tray includes a base, a tray body, a sliding plate, and a limiting spring. The tray body is slidably disposed on the base and has a base portion and two side walls, and the side walls are disposed on two sides of the base portion. The sliding plate is slidably disposed on the base portion and is suitable for being away from or close to one of the side walls relative to the tray body. The limiting spring is disposed on the base portion and is suitable for limiting the sliding plate.

An electronic device of the disclosure includes a casing, a first connector, and a tray. The casing has a bottom portion, and the first connector is disposed in the casing. The tray includes a base, a tray body, a sliding plate, a limiting spring, a handle, and an expansion card. The tray body is slidably disposed on the base and has a base portion and two side walls, and the side walls are disposed on two sides of the base portion. The sliding plate is slidably disposed on the base portion and is suitable for being away from or close to one of the side walls relative to the tray body. The limiting spring is disposed on the base portion and is suitable for limiting the sliding plate. The handle is pivotally connected to the base and is suitable for driving the tray body to move relative to the base. The expansion card is disposed on the tray body. The expansion card includes a second connector, and the second connector of the expansion card is suitable for being driven by the handle to be plugged into the first connector of the casing.

In an embodiment of the disclosure, the base portion of the tray body is provided with a first guiding slot. The sliding plate is provided with a fastening hole, the fastening hole is slidably disposed in the first guiding slot along with the sliding plate, and the expansion card is fastened to the tray body through the fastening hole.

In an embodiment of the disclosure, the limiting spring is disposed on a surface of the base portion of the tray body facing the base, a buckle slot is disposed on the base portion, and a part of the limiting spring is exposed to the buckle slot and abuts against the sliding plate.

In an embodiment of the disclosure, a buckle protrusion of the limiting spring is exposed to the buckle slot of the base portion, a limiting hole is disposed on the sliding plate, and the buckle protrusion is suitable for abutting against an edge of the sliding plate or the limiting hole.

In an embodiment of the disclosure, the tray also includes a spring, correspondingly connected between the sliding plate and the tray body.

In an embodiment of the disclosure, the tray also includes a handle, and the handle includes an assembly portion. The assembly portion is pivotally connected to the base, and the handle is suitable for driving the tray body to move relative to the base.

In an embodiment of the disclosure, a guiding bump is disposed on a side wall of the tray body, and an oblique slot is disposed on the assembly portion of the handle. The guiding bump is movably disposed in the oblique slot, and the oblique slot and the guiding bump interfere with each other when the handle rotates, so that the tray body moves relative to the base.

In an embodiment of the disclosure, the tray also includes a linkage bar assembly, disposed on the base portion. The linkage bar assembly includes a driving member and a driven bar, and the driven bar is connected between the driving member and the sliding plate and is linked with the sliding plate.

In an embodiment of the disclosure, the driving member is a disk, pivotally disposed on the base portion. The driven bar is pivotally disposed between the disk and the sliding plate, and the driving member drives the driven bar to link with the sliding plate to move on the base portion when rotating.

In an embodiment of the disclosure, a guiding slot is disposed on the base portion, and the driving member is a pushbutton, movably disposed in the guiding slot. The driven bar is pivotally disposed between the pushbutton and the sliding plate, and the driving member drives the driven bar to link with the sliding plate to move on the base portion when the driving member moves in the guiding slot.

Based on the above, in the tray of the disclosure, the configuration of the sliding plate enables the tray to adapt to expansion cards of different sizes. In addition, the configuration of the handle enables the tray to be conveniently assembled into the electronic device.

DESCRIPTION OF THE EMBODIMENTS

First Embodiment

Figure 1:
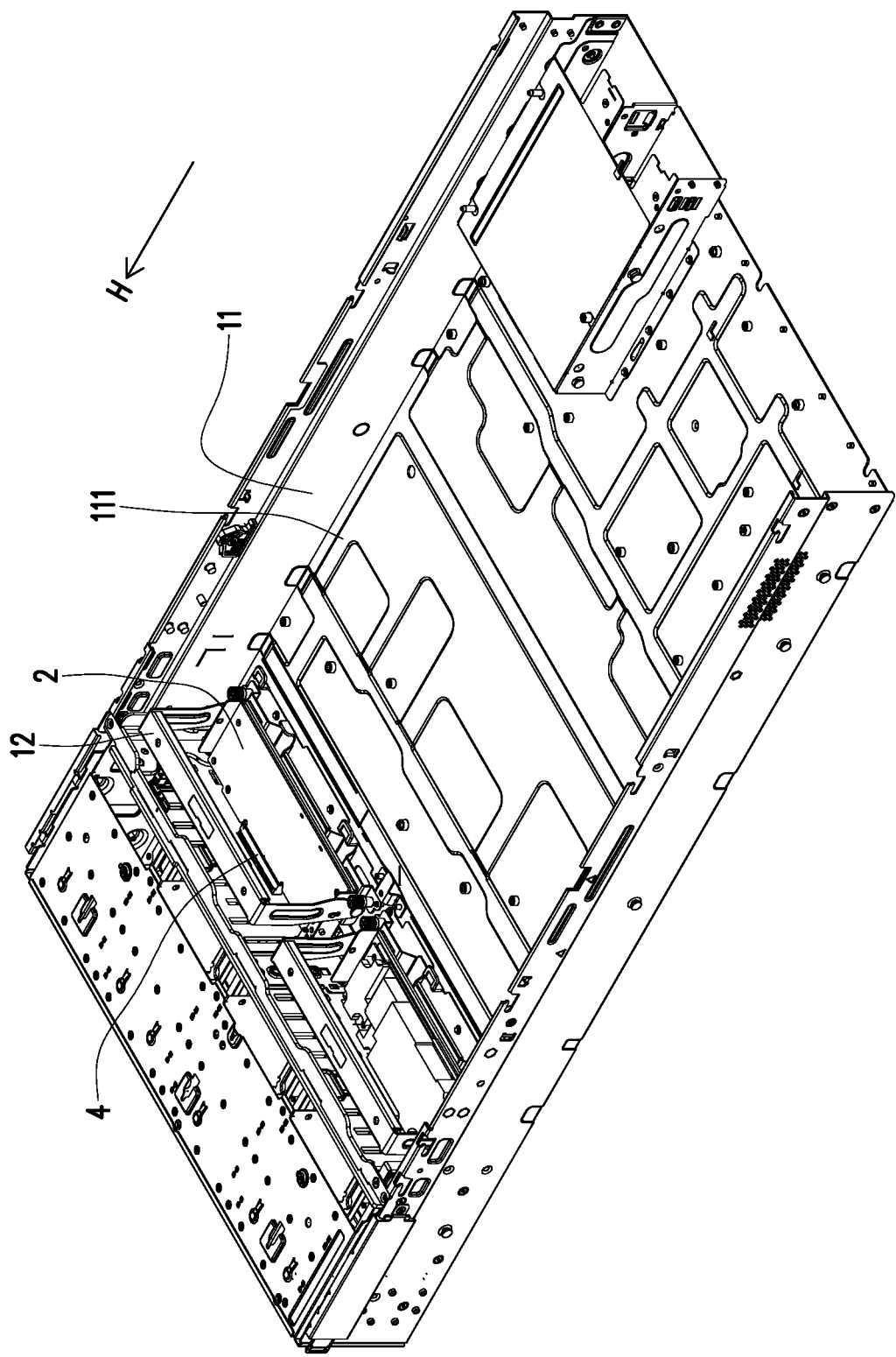
FIG. 1 is a schematic diagram of an electronic device of a first embodiment of the disclosure.
Figure 2:
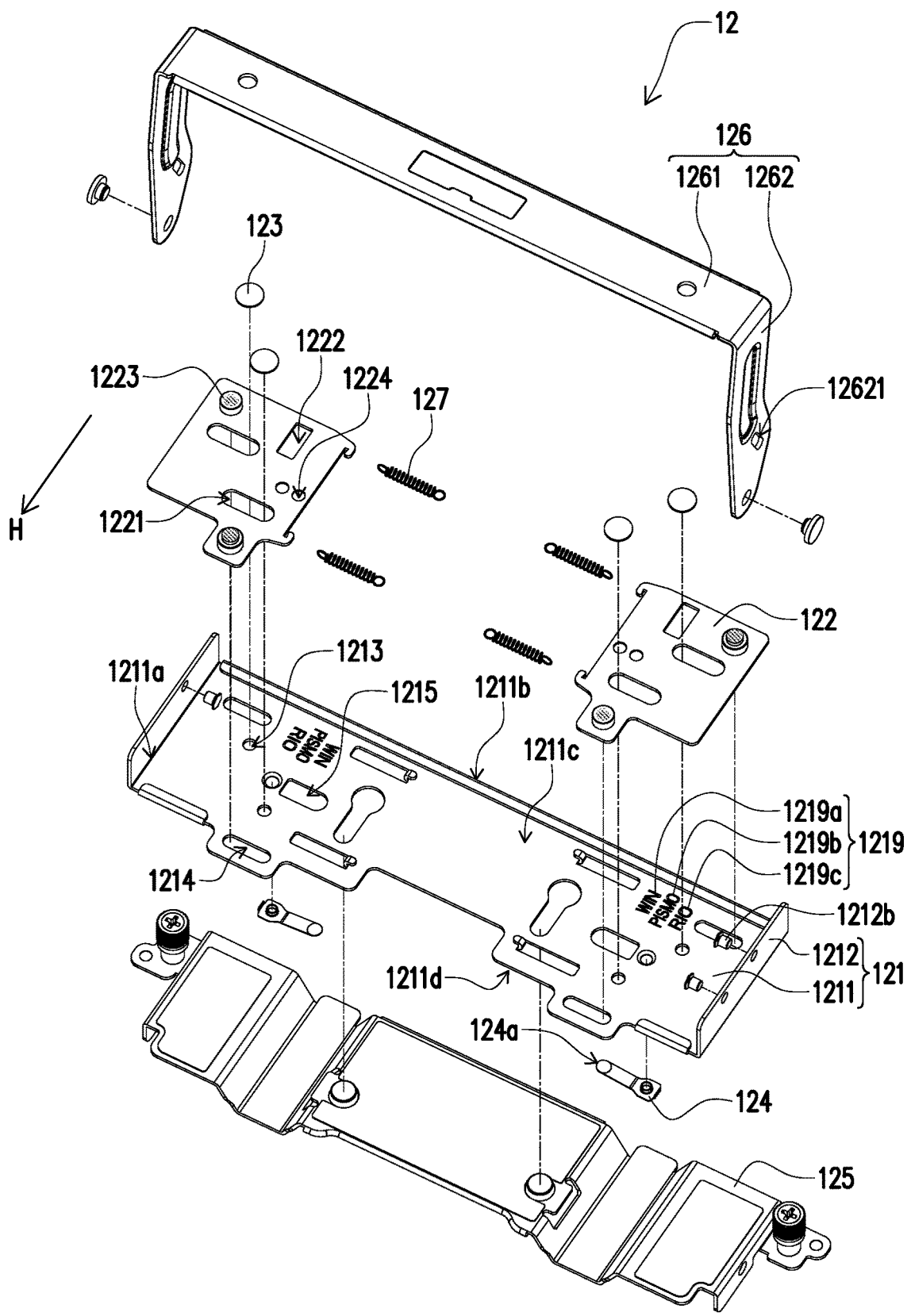
FIG. 2 is a schematic exploded diagram of a tray in an electronic device.
Figure 3:
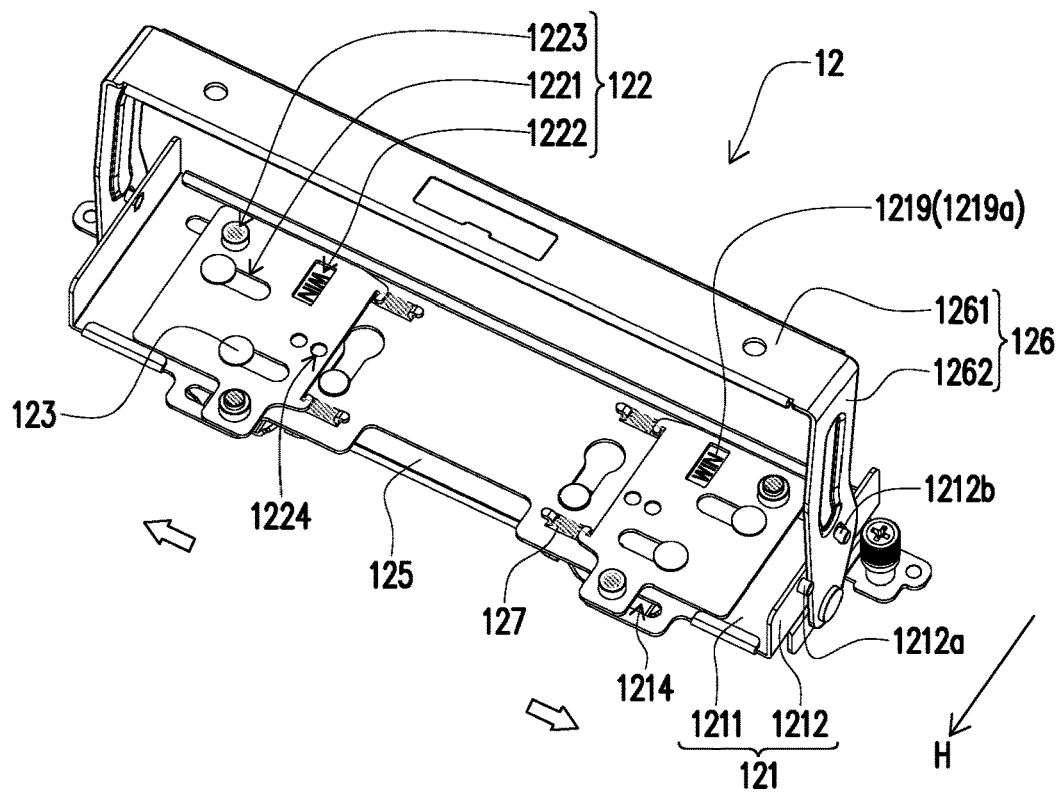
FIG. 3 is a schematic assembly diagram of a tray of FIG. 2.

FIG. 1 is a schematic diagram of an electronic device of a first embodiment of the disclosure, FIG. 2 is a schematic exploded diagram of a tray in an electronic device, and FIG. 3 is a schematic assembly diagram of a tray of FIG. 2.

Please refer to FIG. 1, FIG. 2, and FIG. 3 simultaneously. An electronic device 1 of this embodiment includes a casing 11, a first connector 4, and a tray 12. The casing 11 has a bottom portion 111, and the tray 12 is suitable for carrying an expansion card 2. After the tray 12 enters the casing 11 vertically towards the bottom portion 111 of the casing 11, the tray 12 moves along a horizontal direction H, so that the expansion card 2 assembled on the tray 12 may be plugged into the first connector 4 in the casing 11.

The tray 12 includes a base 125, a tray body 121, a sliding plate 122, a plug 123, a limiting spring 124, and a handle 126.

The tray body 121 has a base portion 1211 and side walls 1212. The side walls 1212 are respectively disposed on two sides of the base portion and connected to a pair of short sides 1211a of the base portion 1211. The base portion 1211 has an opening 1213, a first guiding slot 1214, and a buckle slot 1215.

The sliding plate 122 is movably disposed on the base portion 1211, wherein the sliding plate 122 has a second guiding slot 1221. The plug 123 is inserted through the second guiding slot 1221 of the sliding plate 122 to be fixed in the opening 1213, so that the sliding plate 122 can move relative to the base portion 1211 through the cooperation between the plug 123 and the second guiding slot 1221. Specifically, through the cooperation between the plug 123 and the second guiding slot 1221, the sliding plate 122 can move relative to the base portion 1211 in a direction parallel to a pair of long sides 1211b of the base portion 1211. In more detail, the sliding plate 122 disposed on the base portion 1211 can reciprocate on the base portion 1211 in a manner of being close to the corresponding side wall 1212 or away from the corresponding side wall 1212.

In addition, the sliding plate 122 has a fastening hole 1223 disposed corresponding to the first guiding slot 1214, wherein the fastening hole 1223 may be provided by a stud embedded on the sliding plate 122. When the expansion card 2 is assembled on the tray 12, the expansion card 2 is fixedly fastened to the fastening hole 1223 using a locking member (not shown).

The limiting spring 124 is assembled to the base portion 1211 from a bottom surface 1211d of the base portion 1211 and is exposed to the buckle slot 1215, so that the limiting spring 124 may engage with the corresponding sliding plate 122 to limit the sliding plate 122. Specifically, an end of the limiting spring 124 exposed to the buckle slot 1215 is a buckle protrusion 124a, and the sliding plate 122 also has a limiting hole 1224, wherein along with the position of the sliding plate 122 on the base portion 1211 of the tray body 121, the buckle protrusion 124a may be buckled in the limiting hole 1224; and when the sliding plate 122 moves to a position closest to the side wall 1212, the buckle protrusion 124a contacts the edge of the sliding plate 122 away from the side wall 1212 to limit the position of the sliding plate 122 on the base portion 1211 of the tray body 121.

As mentioned above, the tray 12 further includes a spring 127 correspondingly connected between the sliding plate 122 and the tray body 121. After the limiting spring 124 releases the limitation on the sliding plate 122, the elastic restoring force of the spring 127 drives the sliding plate 122 to return to an original position.

Figure 4:
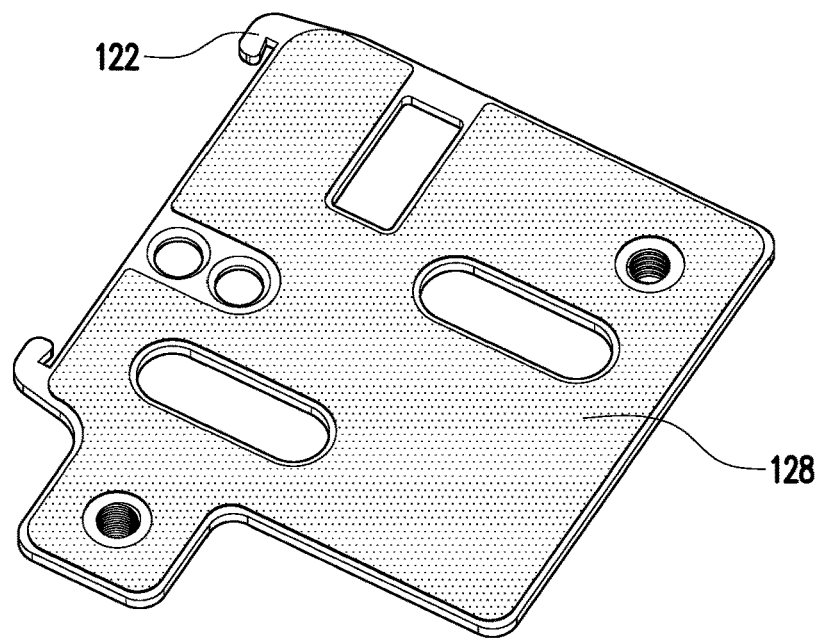
FIG. 4 is a schematic diagram of a film disposed on a surface of a sliding plate facing a base portion.

FIG. 4 is a schematic diagram of a film disposed on a surface of a sliding plate facing a base portion. As a side note, a film 128 may be disposed on the surface of the sliding plate 122 facing the base portion 1211. On the one hand, the configuration of the film 128 increases the friction between the sliding plate 122 and the base portion 1211, preventing the sliding plate 122 from moving quickly relative to the base 1211 and causing damage to a user. On the other hand, the wear caused by the direct contact between the sliding plate 122 and the base portion 1211 can be reduced.

The base 125 is assembled to the base portion 1211 of the tray body 121 from the bottom surface 1211d of the base portion 1211, and the limiting spring 124 is sandwiched between the base 125 and the base portion 1211, wherein the base 125 is used to contact the bottom portion 111 of the casing 11.

The handle 126 is assembled to the base 125. Specifically, the handle 126 is inverted U-shaped and has a grip portion 1261 parallel to the base portion 1211 and an assembly portion 1262 respectively connected to two sides of the grip portion 1261. The assembly portion 1262 is pivotally connected to the base 125, and the base portion 1211 is located between the grip portion 1261 and the base 125. The handle 126 may rotate relative to the base 125 with the hinge of the assembly portion 1262 as the center of rotation.

A limiting bump 1212a may be disposed on the side wall 1212 of the body 121 to limit the angle of rotation of the handle 126 relative to the tray body 121. A guiding bump 1212b is further disposed on the side wall 1212 of the tray body 121 and cooperates with an oblique slot 12621 of the assembly portion 1262 of the handle 126. When the handle 126 rotates along a direction, the mutual interference between the oblique slot 12621 and the guiding bump 1212b drives the tray body 121 to move relative to the base 125. The actuation related to the handle 126 will be described in detail later.

When plugging the tray 12 of this embodiment into the casing 11, the user may push the sliding plate 122 disposed on the base portion 1211 of the tray body 121 to a proper position by hand or a hand tool depending on the size of the expansion card 2, and assemble the expansion card 2 on the tray 12, then fasten the expansion card 2 to the fastening holes 1223 of the two sliding plates 122 using a locking member (not shown).

Figure 5:
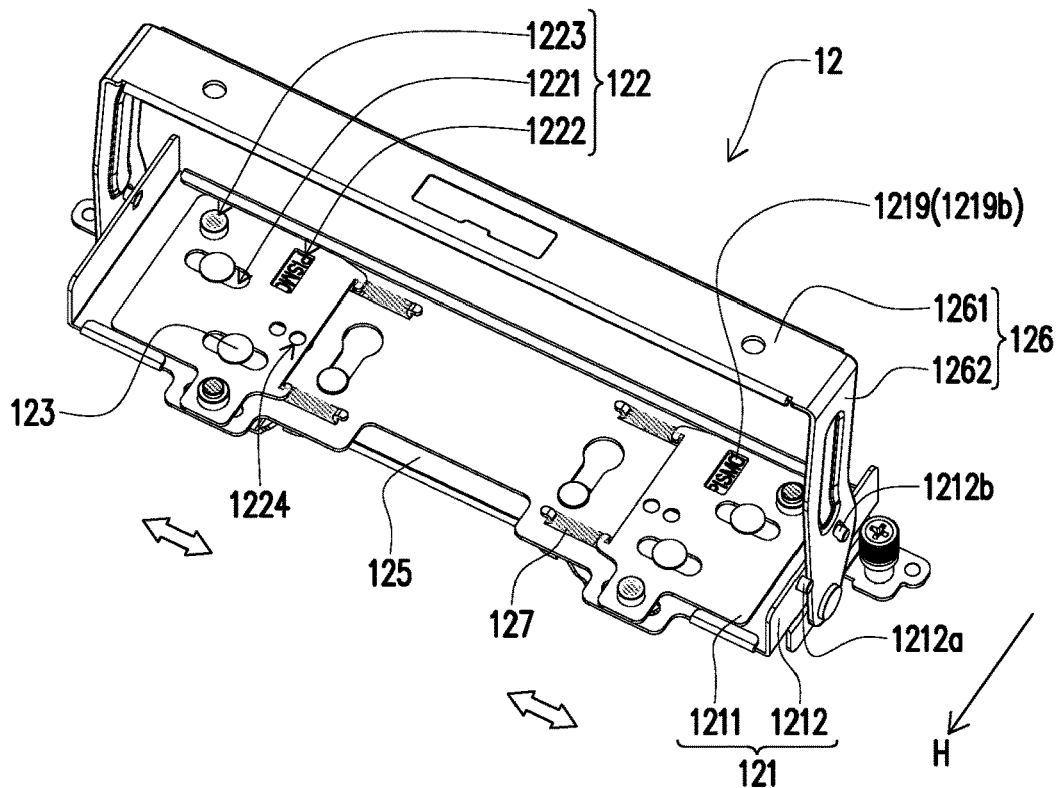
FIG. 5 and FIG. 6 are schematic diagrams of a sliding plate moving to different positions on a base portion.
Figure 6:
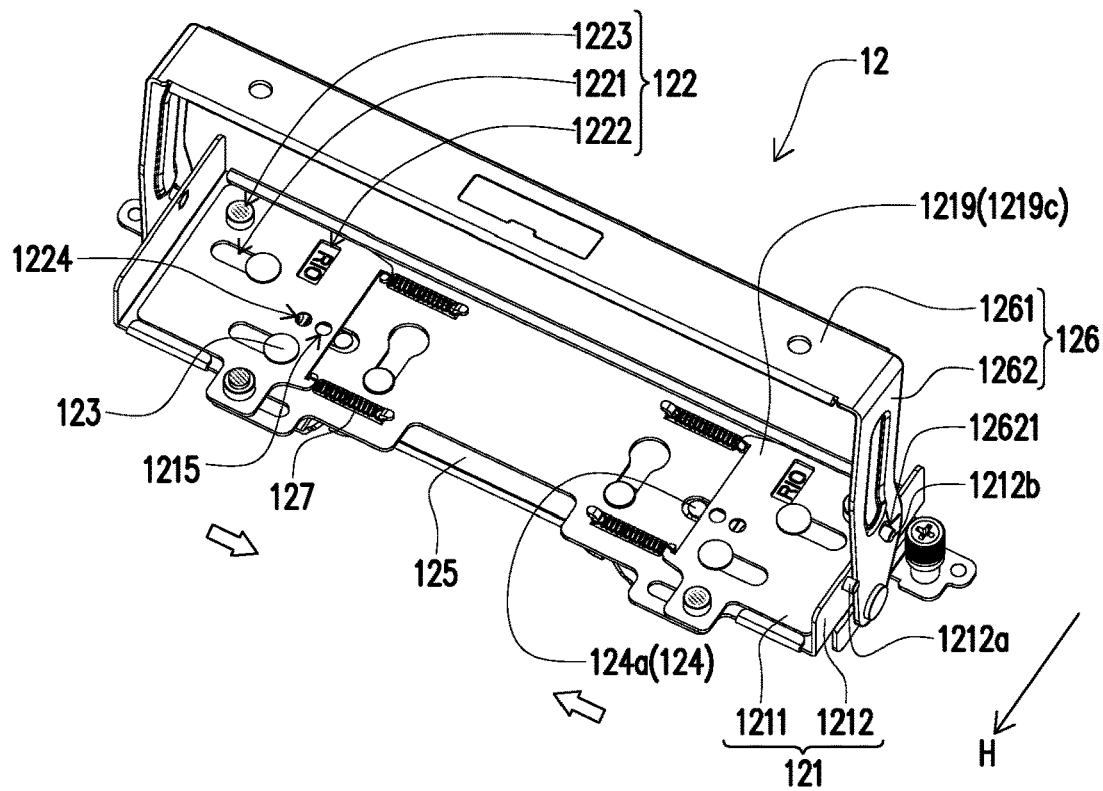

FIG. 5 and FIG. 6 are schematic diagrams of a sliding plate moving to different positions on a base portion. Please refer to FIG. 3, FIG. 5, and FIG. 6 simultaneously. It can be seen that the two sliding plates 122 in FIG. 6 are closest to the side wall 1212, so the distance between the two sliding plates 122 is the largest. The distance between the two sliding plates 122 in FIG. 5 comes second, and the distance between the two sliding plates 122 in FIG. 3 is the smallest. Therefore, in this embodiment, the expansion cards 2 of at least three sizes may be installed in the tray 12 according to the requirements of the user, but not limited thereto. Specifically, by changing the distance between the two sliding plates 122, the tray 12 can be adapted to various expansion cards 2 of different sizes. In addition, in some embodiments, only one sliding plate 122 is disposed on the base portion 1211. Similarly, disposing only one sliding plate 122 also achieves the outcome of installing expansion cards 2 of different sizes on the tray 12 by changing the distance between the sliding plate 122 and the side wall 1212.

It can be seen from FIG. 3 and FIG. 5 that when the sliding plate 122 is at the position shown in FIG. 3 and FIG. 5, the sliding plate 122 covers the buckle slot 1215 (shown in FIG. 2 and FIG. 6). At this time, the position of the sliding plate 122 on the base portion 1211 of the tray body 121 is fixed through buckling the buckle protrusion 124a of the limiting spring 124 to the limiting hole 1224 of the sliding plate 122. When the sliding plate 122 is at the position as shown in FIG. 6, the sliding plate 122 exposes a part of the buckle slot 1215, so the buckle protrusion 124a is exposed from the buckle slot 1215 and abuts against an edge of the sliding plate 122, limiting the position of the sliding plate 122 on the base portion 1211.

As a side note, in order for the user to conveniently identify the size of the expansion card 2 adapted to the position of the sliding plate 122, a marking 1219 is disposed on the base portion 1211 and is disposed on a surface 1211c of the base portion 1211 facing the sliding plate 122. The marking 1219 includes multiple position marks 1219a, 1219b, and 1219c. The sliding plate 122 has an identification hole 1222, and the identification hole 1222 is used to expose one of the corresponding position marks 1219a, 1219b, or 1219c. In terms of this embodiment, the marking 1219 is set to two groups, and each group of the marking 1219 has three position marks 1219a, 1219b, and 1219c. As shown in FIG. 3, FIG. 4, and FIG. 5, when the sliding plates 122 are at different positions, the identification holes 1222 of the two sliding plates 122 expose the same position marks 1219a, 1219b, or 1219c. Specifically, the identification hole 1222 of the sliding plate 122 in FIG. 3 exposes the position mark 1219a, the identification hole 1222 in FIG. 5 exposes the position mark 1219b, and the identification hole 1222 in FIG. 6 exposes the position mark 1219c.

It can be known from FIG. 3, FIG. 5, and FIG. 6 that the tray 12 of this embodiment may be adapted to the expansion cards 2 of three sizes, but not limited thereto. As the size of the tray 12 changes, the size of the expansion card 2 that the tray 12 may be adapted to may also change. In addition, the marking 1219 may be formed on the surface 1211c of the base portion 1211 facing the sliding plate 122 by printing.

After the expansion card 2 is assembled on the tray 12, the user may hold the handle 126 and move the tray 12 vertically towards the bottom portion 111 of the casing 11 from the top of the casing 11 to a fixed point. For example, when the tray 12 touches the bottom portion 111 of the casing 11, the handle 126 is rotated, so that the tray 12 moves along the horizontal direction H, and the expansion card 2 on the tray 12 is plugged into the first connector 4.

Figure 9A:
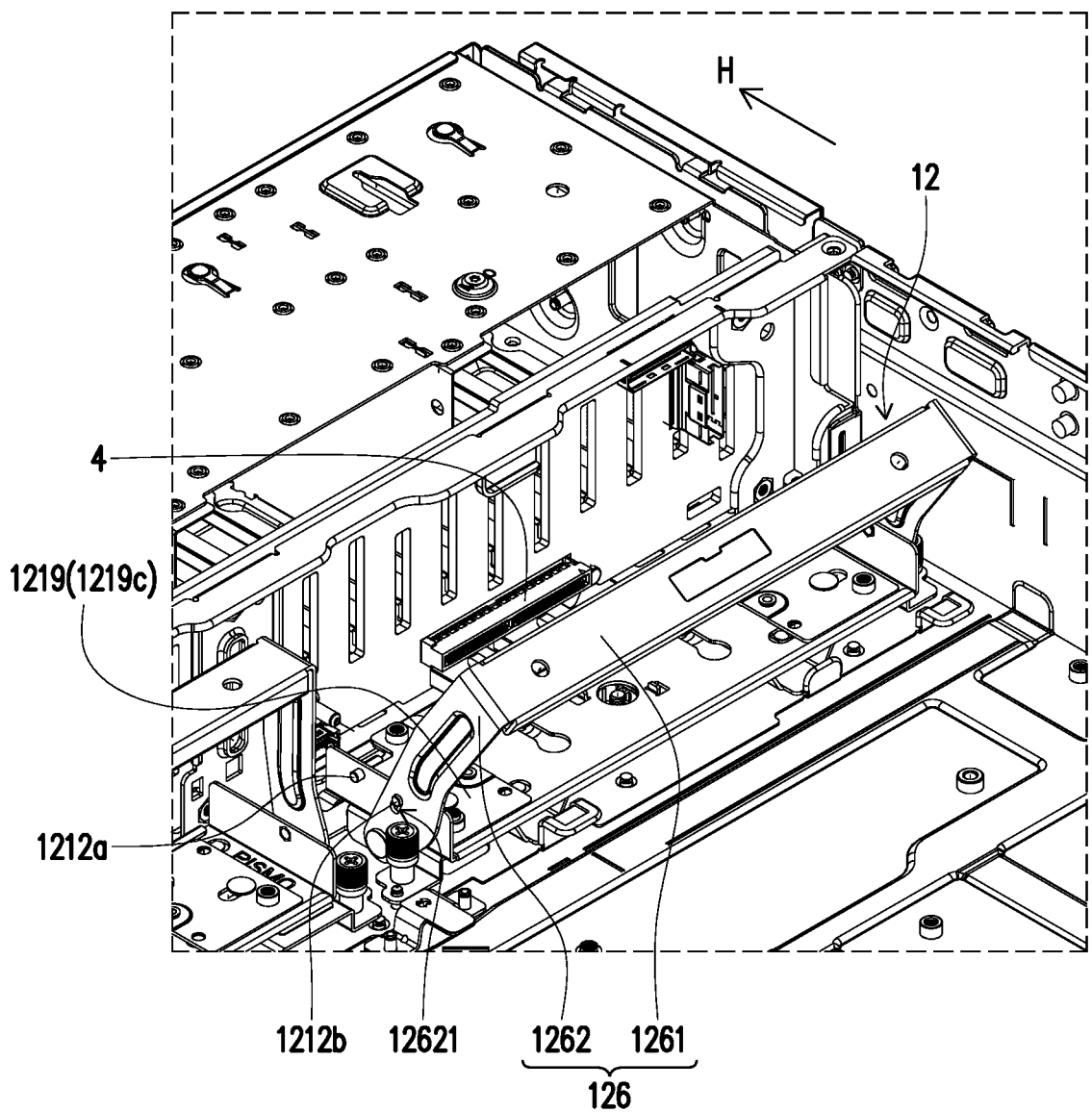
FIG. 9A to FIG. 9C are schematic diagrams of assembling a tray to a casing, so that an expansion card and a first connector are electrically connected.
Figure 9B:
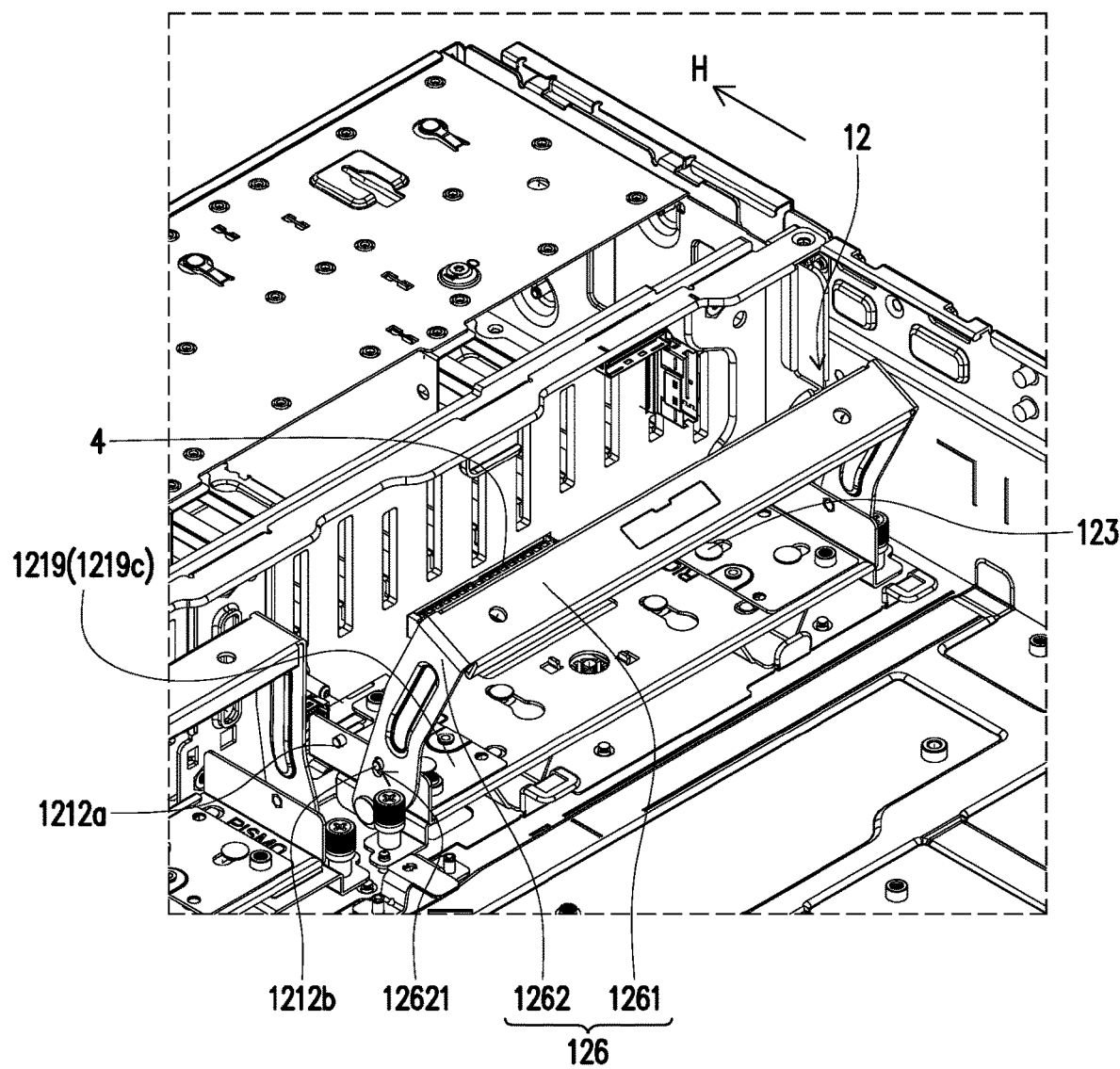
Figure 9C:
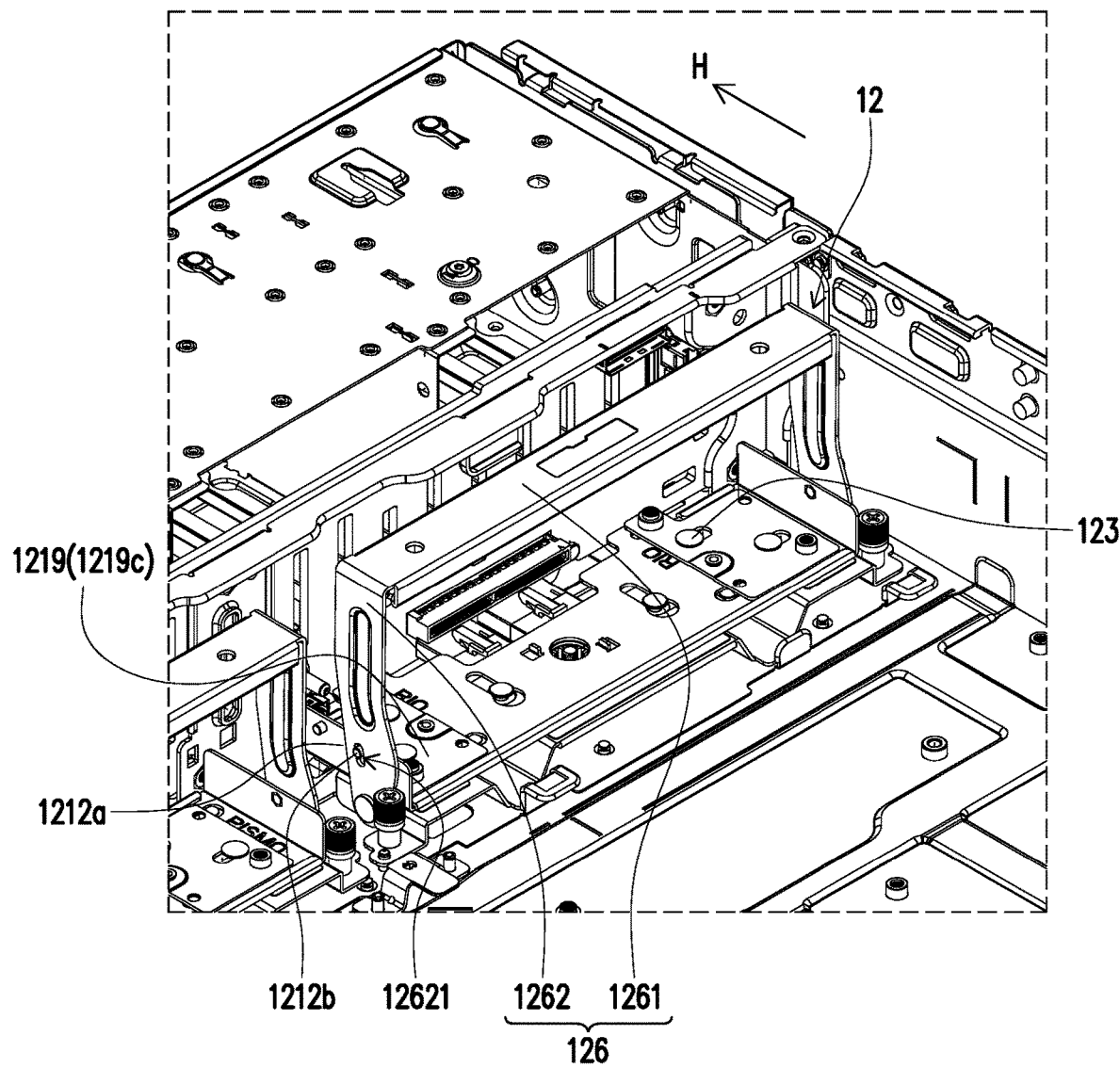

FIG. 9A to FIG. 9C are schematic diagrams of assembling a tray to a casing, so that an expansion card and a first connector are electrically connected. Specifically, the tray 12 is moved vertically toward the bottom portion 111 of the casing 11 until the base 125 of the tray 12 touches the bottom portion 111 of the casing 11, wherein the tray 12 may be preliminarily positioned on the bottom portion 111 of the casing 11 through individually disposed positioning structures (not shown) of the base 125 and the bottom portion 111 of the casing 11. Then, as shown in FIG. 9A, the handle 126 is rotated toward a direction relatively away from the first connector 4 (i.e., the reverse of the horizontal direction H), so that the grip portion 1261 of the handle 126 is in an angular relationship with the base portion 1211, and the assembly portion 1262 of the handle 126 is inclined relative to the base portion 1211. Then, the grip portion 1261 of the handle 126 is rotated to a position parallel to the base portion 1211, as shown in FIG. 9B and FIG. 9C, wherein when the grip portion 1261 rotates, through the mutual interference between the guiding bump 1212b and the oblique slot 12621, the handle 126 drives the tray body 121 to move relative to the base 125 along the horizontal direction H, so that the expansion card 2 carried on the tray 12 is plugged into the first connector 4.

When replacing the expansion card 2 on the tray 12, the grip portion 1261 of the handle 126 is reversely rotated, so that the expansion card 2 is ejected from the first connector 4, and the tray 12 may be conveniently disassembled from the casing 11.

Next, the original expansion card 2 is disassembled from the tray 12. When the sliding plate 122 is at the position as shown in FIG. 6, the buckle protrusion 124a abuts against the edge of the sliding plate 122, so that the sliding plate 122 is limited by the buckle protrusion 124a. At this time, the user may press the buckle protrusion 124a by hand to move the buckle protrusion 124a away from the sliding plate 122 to release the limitation on the sliding plate 122. At this time, the elastic restoring force of the spring 127 drives the sliding plate 122 to return to the original position as shown in FIG. 3.

As mentioned above, the tray of the disclosure may be universally used for expansion cards of different sizes, and it is not necessary to select a tray of corresponding specifications for expansion cards of different specifications, so the tray is universal. In addition, the tray can be easily and conveniently assembled into the casing of the electronic device, so the electronic device to which the tray is applied has the convenience of assembly.

Second Embodiment

Figure 7:
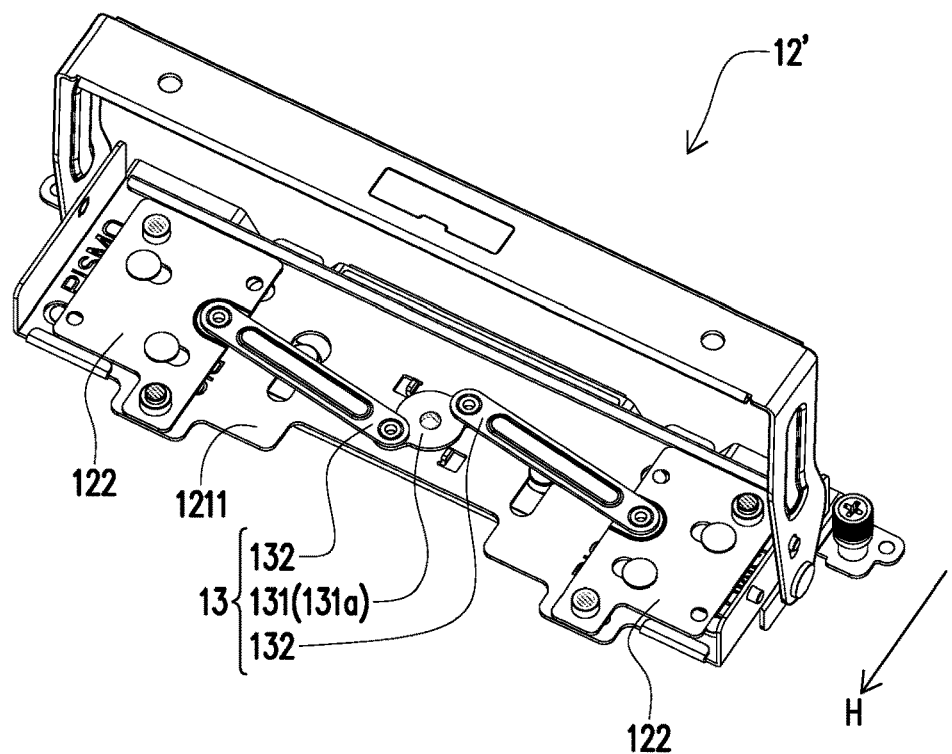
FIG. 7 is a schematic diagram of a tray of a second embodiment of the disclosure.

FIG. 7 is a schematic diagram of a tray of a second embodiment of the disclosure. Referring to FIG. 7, the embodiment is roughly the same as the first embodiment, but the difference is that, a tray 12' further includes a linkage bar assembly 13 that is disposed on the base portion 1211 and is linked with the sliding plate 122. The linkage bar assembly 13 includes a driving member 131 and a pair of driven bars 132. The driven bar 132 is connected between the driving member 131 and the corresponding sliding plate 122.

In this embodiment, the driving member 131 is a disk 131a and is pivotally disposed on the base portion 1211. The driven bar 132 is disposed on the base portion 1211, and two ends of the driven bar 132 are respectively pivotally disposed between the disk 131a and the sliding plate 122. When the user wants to make the two sliding plates 122 relatively close to or away from each other, only the driving member 131 needs to be rotated, and the driving member 131 drives the two driven bars 132 to link with the sliding plate 122 to move on the base portion 1211.

Third Embodiment

Figure 8:
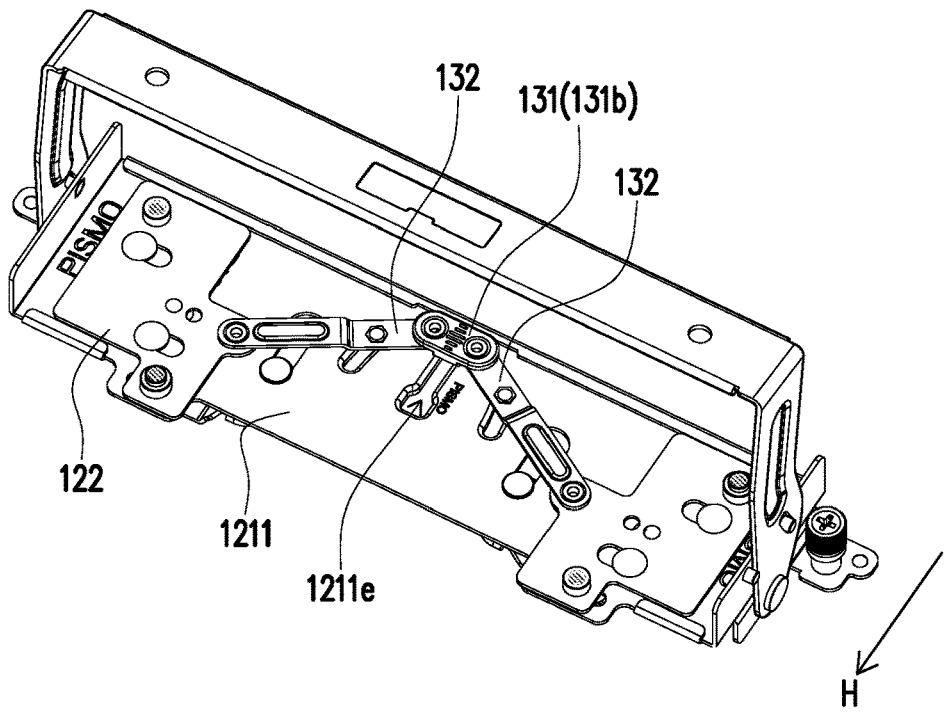
FIG. 8 is a schematic diagram of a tray of a third embodiment of the disclosure.

FIG. 8 is a schematic diagram of a tray of a third embodiment of the disclosure. Referring to FIG. 8, the embodiment is roughly the same as the second embodiment, but the difference is that, the base portion 1211 further includes a third guiding slot 1211e, the extension direction of the third guiding slot 1211e is parallel to the short side 1211a of the base portion 1211, the driving member 131 is a pushbutton 131b, movably disposed in the third guiding slot 1211e, the driven bar 132 is disposed on the base portion 1211, and two ends of the driven bar 132 are respectively pivotally disposed between the pushbutton 131b and the sliding plate 122.

When the user wants to make the two sliding plates 122 relatively close to or away from each other, only the pushbutton 131b needs to be pushed. Through the reciprocating movement of the pushbutton 131b in the third guiding slot 1211e, the pushbutton 131b drives the driven bar 132 to link with the sliding plate 122 to move relatively close to or away from each other on the base portion 1211.

In the second embodiment and the third embodiment, the configuration of the linkage bar assembly enables the two sliding plates 122 to move synchronously to be relatively close to or away from each other, and the reciprocating movement of being relatively close to or away from each other is more intuitive and convenient.

In summary, the tray of the disclosure may be adapted to expansion cards of different sizes, so the tray is universal. In addition, the configuration of the handle enables the tray to be conveniently assembled into the electronic device, which has the convenience of assembly.

What is claimed is:

1. A tray, suitable for carrying an expansion card, comprising:
   a base;
   a tray body, slidably disposed on the base and having a base portion and two side walls, wherein the two side walls are respectively disposed on two sides of the base portion;
   two sliding plates, slidably disposed on the base portion, and the two sliding plates are moved away from or close to each other along a direction from one of the two side walls toward the other one of the two side walls relative to the tray body; and
   two limiting springs, disposed on the base portion, wherein first ends of one side the two limiting springs are connected to the base portion while the second ends of the other side of the two limiting springs are connected the two sliding plates relatively, the sliding plates are limited by the corresponding limiting springs;
   wherein the two sliding plates are disposed between the body portion and the expansion card.

2. The tray according to claim 1, wherein two first guiding slots are disposed at the base portion of the tray body, each of the sliding plates is provided with a fastening hole, and the fastening holes are slidably disposed in the corresponding first guiding slots along with the sliding plates.

3. The tray according to claim 1, wherein the limiting springs are disposed on a surface of the base portion of the tray body facing the base, two buckle slots are disposed on the base portion, and parts of the limiting springs are exposed to the buckle slots and abut against the corresponding sliding plates.

4. The tray according to claim 3, wherein each of the limiting spring is provided with a buckle protrusion exposed to the buckle slots of the base portion, each of the sliding plates is provided with a limiting hole, and the buckle protrusions abut against one of edges of the corresponding sliding plates or the limiting holes correspondingly.

5. The tray according to claim 1, further comprising two springs, correspondingly connected between the two sliding plates and the tray body.

6. The tray according to claim 1, further comprising a handle, wherein the handle comprises an assembly portion, wherein the assembly portion is pivotally connected to the base, and the tray body is driven to move relative to the base via the handle selectively.

7. The tray according to claim 6, wherein a guiding bump is disposed on a side wall of the tray body, an oblique slot is disposed on the assembly portion of the handle, the guiding bump is movably disposed in the oblique slot, and the oblique slot and the guiding bump interfere with each other to drive the tray body to move relative to the base when the handle rotates.

8. The tray according to claim 1, further comprising a linkage bar assembly, disposed on the base portion and comprising a driving member and two driven bars, wherein the driven bars are connected between the driving member and the corresponding sliding plates.

9. The tray according to claim 8, wherein the driving member is a disk, the driven bars are pivotally disposed between the disk and the corresponding sliding plates, and when the driving member is rotating, the sliding plates are driven by the driving bars to move on the base portion.

10. The tray according to claim 8, wherein a guiding slot is disposed on the base portion, the driving member is a pushbutton movably disposed in the guiding slot, the driven bars are pivotally disposed between the pushbutton and the corresponding sliding plates, and the sliding plates are driven by the driving member via the driven bars to move on the base portion when the driving member moves in the guiding slot.

11. An electronic device, comprising:
    a casing, having a bottom portion;
    a first connector, disposed in the casing;
    a tray, comprising:
    a base;
    a tray body, slidably disposed on the base and having a base portion and two side walls, wherein the two side walls are respectively disposed on two sides of the base portion;
    a sliding plate, slidably disposed on the base portion and selectively moved away from or close to one of the side walls relative to the tray body;
    a limiting spring, disposed on the base portion, wherein the sliding plate is limited by the limiting spring selectively;
    a handle, pivotally connected to the base, wherein the tray body is driven by the handle to move relative to the base; and
    an expansion card, disposed on the tray body and comprising a second connector;

wherein, the second connector of the expansion card is driven by the handle to be plugged into the first connector of the casing selectively.

12. The electronic device according to claim 11, wherein a first guiding slot is disposed on the base portion of the tray body, a fastening hole is disposed in the sliding plate, the fastening hole is slidably disposed in the first guiding slot along with the sliding plate, and the expansion card is fastened to the tray body through the fastening hole.

13. The electronic device according to claim 11, wherein the limiting spring is disposed on a surface of the base portion of the tray body facing the base, a buckle slot is disposed on the base portion, and a part of the limiting spring is exposed to the buckle slot and abuts against the sliding plate.

14. The electronic device according to claim 13, wherein a buckle protrusion of the limiting spring is exposed to the buckle slot of the base portion, a limiting hole is disposed on the sliding plate, and the buckle protrusion abuts against one of edges of the sliding plate or the limiting hole selectively.

15. The electronic device according to claim 11, wherein the tray further comprises a spring, correspondingly connected between the sliding plate and the tray body.

16. The electronic device according to claim 11, wherein the tray further comprises a linkage bar assembly, disposed on the base portion and comprising a driving member and a driven bar, wherein the driven bar is connected between the driving member and the sliding plate and is linked with the sliding plate.

17. The electronic device according to claim 16, wherein the driving member is a disk, pivotally disposed on the base portion, the driven bar is pivotally disposed between the disk and the sliding plate, and when the driving member is rotating, the sliding plate is driven to move on the base portion via the driving bar.

18. The electronic device according to claim 16, wherein a guiding slot is disposed at the base portion, the driving member is a pushbutton movably disposed in the guiding slot, the driven bar is pivotally disposed between the pushbutton and the sliding plate, and the sliding plate is driven by the driving member via the driven bar to move on the base portion when the driving member moves in the guiding slot.

19. The electronic device according to claim 11, wherein the handle comprises an assembly portion, an oblique slot is disposed on the assembly portion, a guiding bump is disposed on a side wall of the tray body, the guiding bump is disposed in the oblique slot, and the oblique slot and the guiding bump interfere with each other to drive the tray body to move relative to the base when the handle rotates.

20. A tray, suitable for carrying an expansion card, comprising:
a base;
a tray body, slidably disposed on the base and having a base portion and two side walls, wherein the two side walls are respectively disposed on two sides of the base portion;
a sliding plate, slidably disposed on the base portion, and selectively moved away from or close to one of the side walls relative to the tray body; and
a limiting spring, disposed on the base portion, wherein the sliding plate is limited by the limiting spring selectively,
wherein a distance between the sliding plate to the corresponding side wall is variable according to different sizes of the expansion card.

* * * * *